United States Patent [19]
Kantrowitz

[11] 3,940,615
[45] Feb. 24, 1976

[54] WIDE ANGLE ISOTOPE SEPARATOR

[75] Inventor: Arthur Kantrowitz, Cambridge, Mass.

[73] Assignee: Jersey Nuclear-Avco Isotopes, Inc., Bellevue, Wash.

[22] Filed: Feb. 2, 1973

[21] Appl. No.: 328,955

[52] U.S. Cl. .................... 250/284; 310/11; 322/2 R
[51] Int. Cl.² .................... B01D 59/44; H01J 39/34
[58] Field of Search ........ 250/284; 310/11; 322/2 R

[56] References Cited
UNITED STATES PATENTS

| | | | |
|---|---|---|---|
| 2,735,016 | 2/1956 | Sheer et al. | 250/284 |
| 3,004,158 | 10/1961 | Steimel | 250/284 |
| 3,179,873 | 4/1965 | Rosa | 322/2 R |
| 3,210,642 | 10/1965 | Rasa | 322/2 R |
| 3,257,571 | 6/1966 | Jones | 310/11 |
| 3,443,087 | 5/1969 | Robieux et al. | 250/284 |
| 3,772,519 | 11/1973 | Levy et al. | 250/284 |

*Primary Examiner*—Harold A. Dixon
*Attorney, Agent, or Firm*—Weingarten, Maxham & Schurgin

[57] ABSTRACT

For particle separation, a method and apparatus for using a wide angle radially expanding vapor of a particle mixture. In particular, selective ionization of one isotope type in the particle mixture is produced in a multichamber separator and the ionized isotope type is accelerated out of the path of the vapor expansion for separate collection.

31 Claims, 3 Drawing Figures

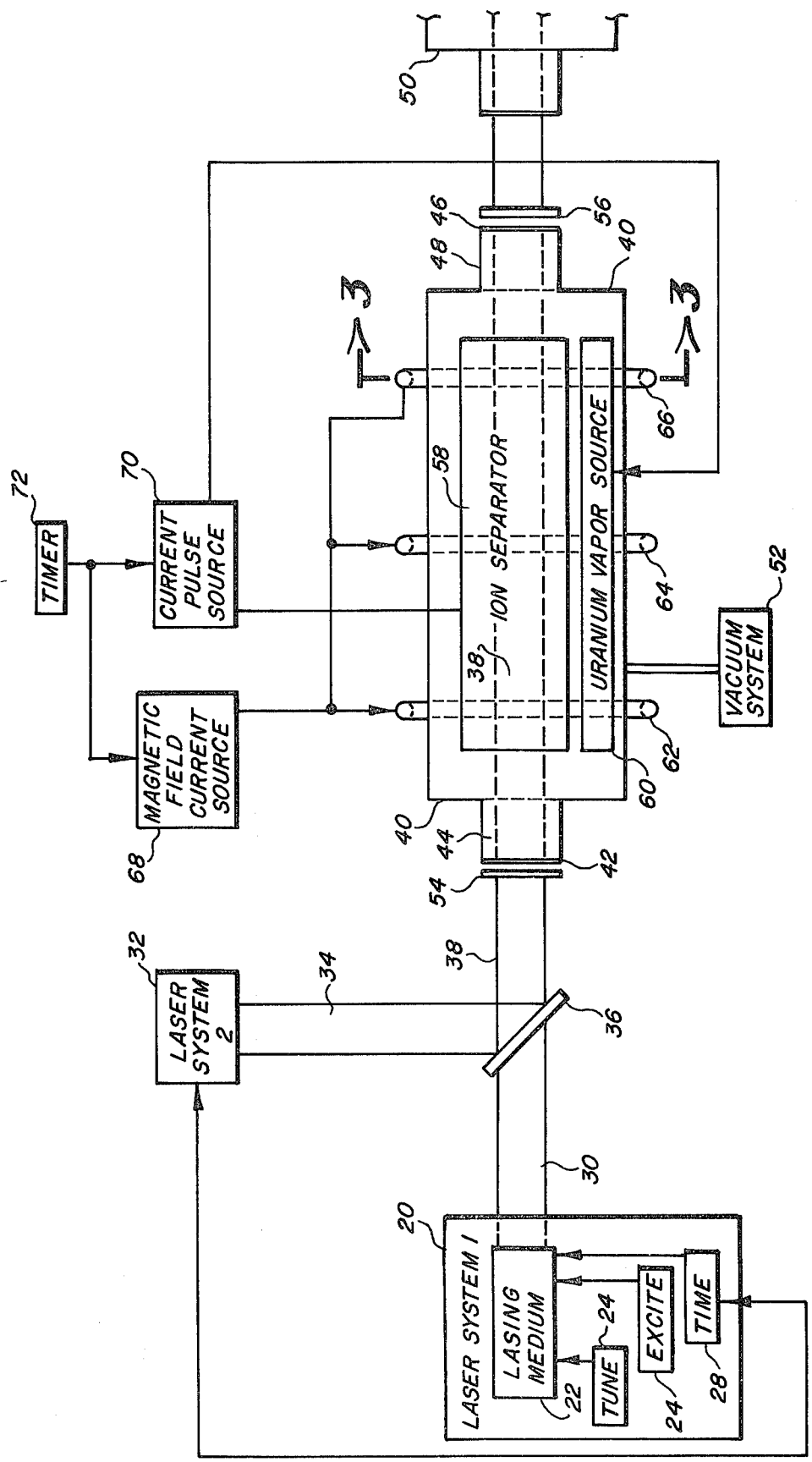

3,940,615

WIDE ANGLE ISOTOPE SEPARATOR

FIELD OF THE INVENTION

This invention relates to isotope separation by selective ionization and in particular to a separation system making efficient use of an isotope source.

BACKGROUND OF THE INVENTION

Nearly all fission reactions utilizing the uranium isotope, $U_{235}$, require a concentration of the $U_{235}$ isotope greater than in the naturally occurring state. The process of enrichment whereby the concentration of $U_{235}$ in natural or depleted uranium is raised to a desired level has been achieved in the past by many techniques which generally operate to separate $U_{235}$ from the other uranium isotopes, chiefly $U_{238}$, on the basis of its slight chemical or mass difference. Enrichment according to these techniques often requires cascaded processing using a sequence of repeated applications of the same steps, each step providing a slight increase in the concentration of the desired $U_{235}$ isotope.

A promising technique for more efficiently separating the $U_{235}$ isotope operates by selectively ionizing this isotope in a vapor of uranium without correspondingly ionizing the $U_{238}$ isotope in the vapor. The ionization gives to the desired $U_{235}$ isotope an electrical characteristic which permits it to be separated from the rest of the components of the uranium vapor. The uranium is converted to a vapor state to facilitate the application of ionizing energy in the form of laser radiation to the uranium and to provide a volume of relatively mobile particles from which the ionized uranium atoms may be separated using crossed-field MHD accelerator techniques. The process of enrichment is typically continuous by providing repeated application of laser radiation and acceleration forces in sequence so that it is desirable to continuously generate the vapor as by heating the uranium to provide a vapor flow.

As is known, evaporation of a material to the gas or vapor state produces a generally expanding volume of the gas in all directions. Nevertheless, the physics of crossed-field MHD acceleration of ionized particles in a vapor or plasma generally increase in efficiency with decreasing dimensions of the separation region. This is, at least in part, due to limitations of the mean free path of accelerated particles, it being desirable to collect the accelerated particles in distances where there is little probability of diverting particle collisions with other constituents to occur. Thus while it is desirable to accept the large angle of vapor flow which is generally created, theory advocates relatively small areas for the crossed-field separation process.

Additionally, separation of the ionized particles from the vapor is efficiently achieved where a well defined vapor flow having a uniform local particle direction can be maintained such that ionized particles may be accelerated in an orthogonal direction and both the ionized particles and the remaining vapor constituents separately collected for removal from the system as uranium enriched in the respective isotope concentrations. This desirable separation condition is typically facilitated by confining the area and angle of the vapor flow.

BRIEF SUMMARY OF THE INVENTION

In accordance with the teaching of the present invention an enrichment system using selective ionization is shown wherein a vapor of uranium produced as a radially expanding vapor drift over a substantial angle is directed toward a surrounding multichambered crossed-field MHD accelerator placed to receive the radially expanding vapor over a corresponding angle and provide, after selective ionization, separation of ionized and non-ionized vapor particles into two orthogonal motions. System efficiency is thereby improved by adapting the ion separator to accept the wide angle expansion of the uranium vapor. Moreover, the need for periodic cleaning of the vapor generating apparatus from recycling of unused vapor is reduced.

In particular implementation, an electron beam is focused to strike the surface of uranium metal over a long thin line and to create local vaporization at the points of impact along the line. Vaporized uranium expands radially away from the impact line into a region where application of laser energy produces a plasma containing selectively ionized atoms of the desired $U_{235}$ isotope without correspondingly ionized atoms of the other components of the vapor. A plurality of ion separating and collecting chambers enclose the ionization region and operate to impart to the ions of the plasma a velocity substantially perpendicular to the radial velocity of the plasma as a whole. It is thereby possible to collect the separately directed particles of the $U_{235}$ isotope apart from the rest of the vapor which is permitted to continue on its radial path for collection and removal from the system.

As a result of this technique, it is possible to provide an increased efficiency in the generation and utilization of the uranium vapor. Moreover, the system can operate without cleaning for greater periods of time and a greater enrichment yield is possible without increased system and operating cost.

BRIEF DESCRIPTION OF THE DRAWINGS

These and other features of the present invention will be more fully understood by reference below to the detailed description of a preferred embodiment presented for purposes of illustration, and not by way of limitation, and to the accompanying drawings of which:

FIG. 2 is a diagram of apparatus used for isotope separation according to the present invention.

DETAILED DESCRIPTION OF THE PREFERRED EMBODIMENT

The present invention generally contemplates a particle separation technique utilizing a particle flow having a wide angle, radial, or typically cosine, distribution of particle movement, where in general, the particles may be atoms, molecules or other particles however produced.

Figure 1:
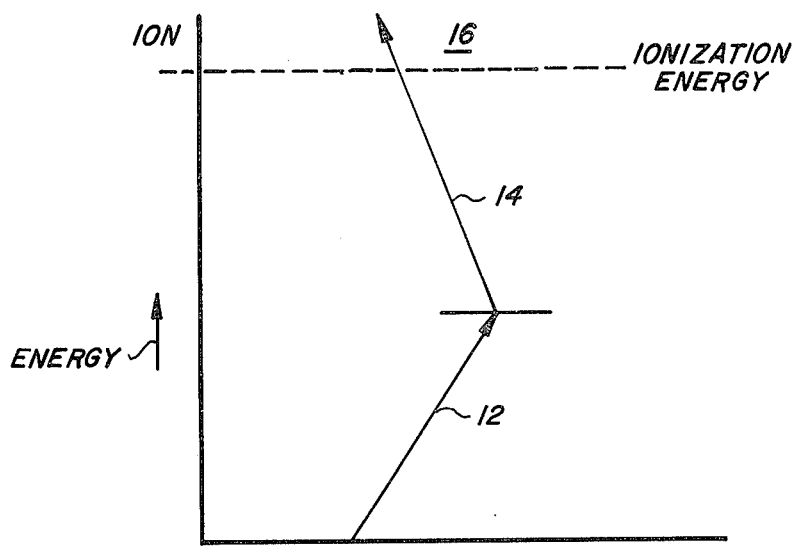
FIG. 1 is an energy level diagram useful in explaining an ionization process for use in the invention.

In particular implementation, the invention is usefully adapted for $U_{235}$ enrichment by employing a method and apparatus for selective ionization of the $U_{235}$ isotope from naturally occurring or depleted uranium. By illuminating a vapor of elemental uranium with laser radiation to produce selective ionization of the desired $U_{235}$ isotope, the $U_{235}$ particles are given a characteristic which permits them to be collected separately from the vapor. As indicated in FIG. 1, the process of selective ionization may include a two-step excitation of atoms of the desired isotope, represented by energy steps 12 and 14 to an ionization region 16, above approximately 6.2 ev for uranium. In typical implementation for FIG. 1 the transition 12 is achieved by exposing the uranium vapor to a narrow bandwidth laser radiation having a frequency which corresponds to an absorption line for the desired $U_{235}$ isotope but which does not encompass correspondingly an absorption line for other isotopes in the vapor. Additional laser radiation having a controlled frequency produces the transition 14 into the ionization region 16 of the FIG. 1 energy level diagram. While not necessary to understanding and practicing the present invention, further system considerations may be found in French Pat. No. 71.14007, granted Jan. 10, 1972 (Publication No. 2.094.967) and incorporated herein by reference.

A system employing the selective ionization technique indicated in FIG. 1 will typically include a generator for producing a uranium vapor and a separator for collecting the ionized isotope apart from the non-ionized components which are subsequently removed from the system. It is desirable that the vapor velocity carry the vapor particles into the ion collector where local vapor particle motion is kept unidirectional. Radiant energy which includes one or more frequencies is applied to the vapor in the ion collector and creates a plasma of selectively ionized $U_{235}$ ions, and a crossed-field MHD accelerator in the ion collector is employed to impart to the ions a velocity in a second direction which is typically othogonal to the vapor direction so as to create two othogonal particle flows, one comprising the desired $U_{235}$ isotope in a proportion substantially greater than it exists in the original vapor and the other flow comprising the rest of the vapor. Separate flows are thus established which may be independently collected, typically on collection plates, for subsequent removal and use.

Figure 3:
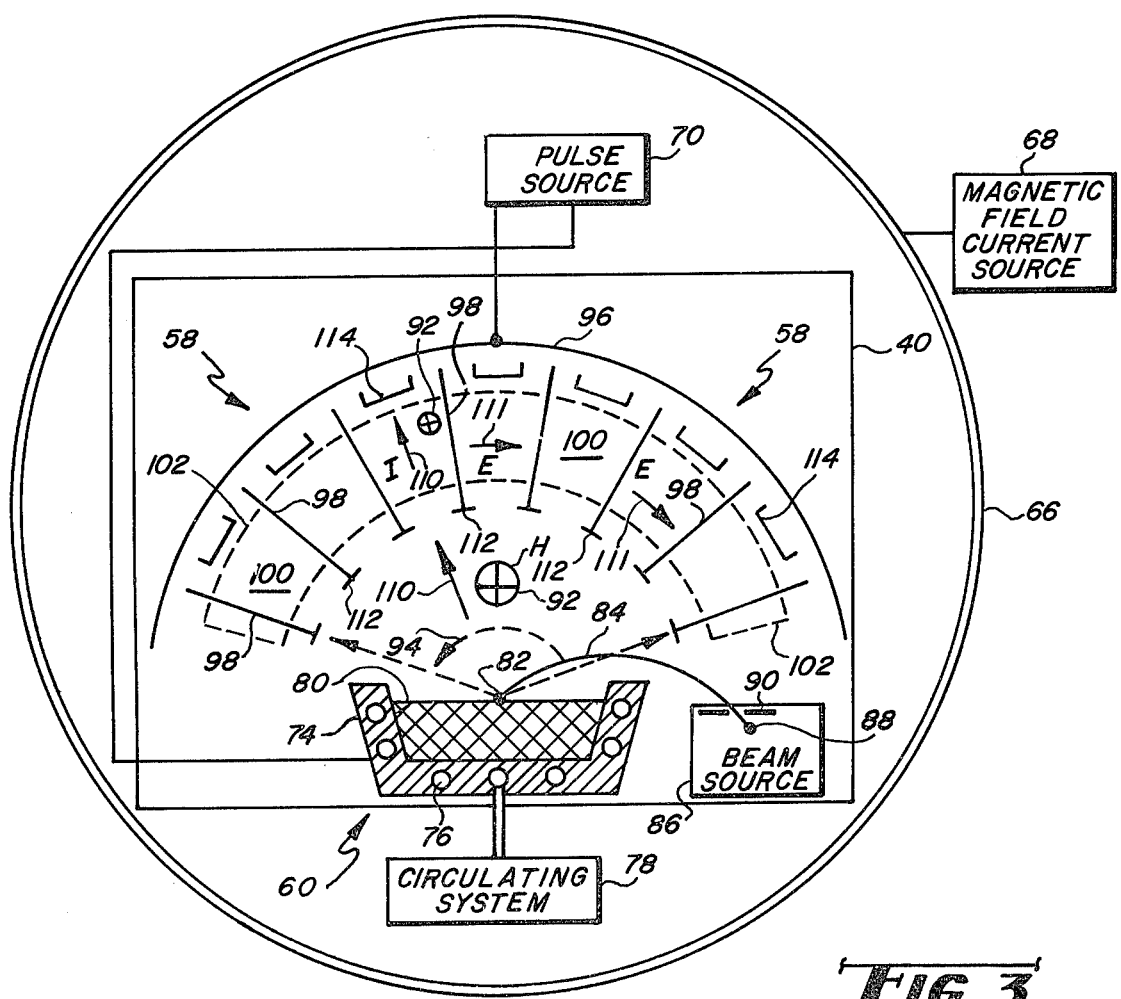
FIG. 3 is an internal sectional view of a portion of the apparatus of FIG. 2 along the section lines indicated there.

With reference now to FIGS. 2, 3 and 4 there is shown a system for isotope separation generally according to the above indicated principle but at a substantial increase in efficiency by improvements in the ion collection apparatus which permit more efficient use of uranium vapor generation.

With reference now to FIG. 2, a system is disclosed for the vaporization of uranium metal, selective ionization of the $U_{235}$ isotope in the vapor and separate collection of the ionized isotope. In particular, a laser system 20 is provided and typically comprises a tunable dye laser having a lasing medium 22 such as a dye solution and a respective tuning system 24, excitation system 26 and timing system 28 operative with the lasing medium 22 to control the frequency of the system output beam 30, to provide the excitation energy for the medium 22 and to initiate the pulse output. If desired, laser beam 30 may be subjected to one or more stages of amplification.

The laser system 20 may be one of the "*Dial-A-Line*" lasers of the Avco Everett Research Laboratory generally shown in U.S. Pat. No. 3,684,979 and adjusted to provide a narrow bandwidth output beam corresponding in frequency to an absorption line for the $U_{235}$ isotope but not to the other isotopes in the uranium vapor being ionized. The radiation in beam 30 is typically employed to produce the energy step 12 in FIG. 1. Where necessary to provide the desired narrow bandwidth, an etalon filter may be used on the output beam 30. A typical absorption line for $U_{235}$ to produce transition 12 from the ground state for $U_{235}$ to the intermediate excited level may be found in the literature such as LA-4501 *Present Status of the Analyses of the First and Second Spectra of Uranium (UI and UII) as Derived from Measurements of Optical Spectra;* Los Alamos Scientific Laboratory of the University of California, available from National Technical Information Service, U.S. Department of Commerce.

A second laser system 32 is typically employed to provide a radiation in a beam 34 with sufficient photon energy to produce the ionization step 14. Laser beam 34 from the laser system 32 is combined with the beam 30 by a dichroic mirror 36 to produce a composite beam 38.

The laser beam 38 is applied to a chamber 40 through a window 42 on a pipe 44. The window 42 is transmissive to the frequencies of the radiation in beam 38 and the pipe 44 protects it from contamination by the uranium vapor in chamber 40. Window 42 may typically be quartz crystal. The beam 38 transverses the chamber 40 and exits through a rear window 46 and pipe 48 and may continue on through one or more additional chambers 50 to provide greater utilization of the energy in the beam 38.

The chamber 40 is evacuated through a vacuum system 52 to maintain a low pressure within the chamber 40 to prevent interference with the ionization and collection processes through chemical reactions or particle collisions. In passing through chamber 40 the beam 38 is reflected by mirror systems 54 and 56, preferably located outside of chamber 40 to prevent uranium contamination, for multiple traversals of an ion separator 58 where uranium vapor provided by a source 60 is illuminated to produce selective ionization. Subsequent separation is achieved through the interaction of a magnetic field, coaxial to laser beam 38, and an electric current between the vapor source 60 and the ion separator 58. The magnetic field is produced by coils 62, 64 and 66 coaxial to beam 38 and excited by a magnetic field current source 68, through other means of generating a field may be used. The electric current is produced between vapor source 60 and separator 58 by a current pulse source 70. A conventional timer 72 is connected to the timer systems 28 of laser system 20 and 32 and to pulse source 70 to provide repetitive sequencing of the laser radiation and electric current as will be described below.

The details of the chamber 40 may best be understood by reference to FIG. 3. In FIG. 3 the uranium vapor source 60 is indicated as comprising a long crucible 74 having passages 76 through the walls thereof that communicate with a circulating system 78 for a cooling fluid. The crucible 74 contains a mass of uranium 80 which is illuminated along a line 82 of its exposed surface by an electron beam 84 from a beam source 86 which may typically include a long filament 88 and accelerator plates 90. Focusing is provided by the magnetic field 92 produced by coils 62, 64 and 66 to direct the beam 84 to a focus along the line 82. Evacuation of chamber 40 prevents interference with beam 84 or filament 88. Other configurations for containing or heating of the uranium or other material are contemplated.

Sufficient heating of the uranium 80 to at least partially liquefy it is provided by the energy in the incident electron beam 84. Local heating along the line 82 is employed to cause vaporization of the uranium in the vicinity of the line 82 by providing an appropriate flux in the electron beam 84.

The expansion for the uranium vapor is recognized to be a two dimensional, radial expansion away from the line 82 and to have a cosine distribution over an angle 94. The evaporating uranium expands, cools and reaches a substantial velocity in the low pressure of chamber 40. The evaporated uranium particles will, at some distance from line 82, be moving substantially radially over the relatively wide angle 94. More particularly the velocity distribution is elliptical about any radial line with the minor elliptical axis in the circumferential direction so that the particle velocity is generally in radial planes. While other vapor sources may be substituted, it can be appreciated that the recognized properties of this evaporation technique facilitates the provision of a substantially unique velocity direction for the expanding uranium at any given point.

The expanding uranium vapor is directed toward the ion separator 58 which is indicated as comprising an electrode 96 in the shape of a cylindrical arc over angle 94 extending lengthwise into the page. A plurality of plates 98 extend radially inward toward the source line 82 to divide the ion separator 58 into a plurality of chambers 100. The plates 98 similarly run the length of the chamber 40, shown in FIG. 3 as extending into the page. An interaction region 102 in the shape of a cylindrical arc is defined as extending into the page in a section which encompasses the interior of the chambers 100. The laser beam is directed through the region 102 in multiple traversals perpendicular to the page to sequentially illuminate each chamber 100 by the mirrors 54 and 56. Alternatively, a plurality of laser systems may be provided to establish a separate beam 38 for each chamber 100.

In operation, in FIG. 3, the radially expanding vapor 92 will in general be continuously provided by the continuous application of the electron beam 84. The timer system 72 will typically periodically excite both laser systems 20 and 32 to provide simultaneous laser beam output pulses for a duration in the range of a substantial fraction of a microsecond at a repetition rate preferably sufficient to illuminate substantially all atoms in the vapor. Directly subsequent to each laser beam pulse a periodic pulse of electrical current 110 is drawn from the electrode 96 and the crucible 74 through the pulse source 70 which has its output leads connected thereto. The current pulse has a duration of approximately 2 microseconds, and a magnitude in the range of approximately 1 to 10 amperes/cm$^2$ near plates 98 for a magnetic field intensity of 100 to 1000 gauss. It is also preferable to maintain the separation between plates 98 at less than the kinetic mean free path for the plasma to prevent deflection of desired $U_{235}$ atoms.

The current pulse 110 with magnetic field 92 creates a circumferential electric field 111 in the region between the plates 98. The current 110, electric field 111 and magnetic field 92 operate according to crossed-field MHD acceleration principles to react upon the ions of $U_{235}$ created by the laser beam 38 in region 102 for acceleration of the ions toward one of the plates 98 for collection. There will then be produced a flow of desired $U_{235}$ atoms toward one of the plates 98 in a direction orthogonal to the local velocity of the radial vapor expansion. The flow from the crossed-field acceleration will contain a concentration of the desired $U_{235}$ isotope substantially greater than in the vapor. This orthogonal flow will also permit separate collection of both the enriched $U_{235}$ and the remainder of the vapor on respective plates 98 and electrode 96. Periodically, the electrode 96 and the plates 98 may be cleaned to recover separately the enriched $U_{235}$ uranium and the depleted uranium.

Among the practical considerations for the system, it is known that each $U_{235}$ ion may experience a charge exchange interaction with a non-ionized vapor atom creating an ionized vapor atom and restoring charge neutrality to the desired $U_{235}$ atom. It is thus preferable that the crossed-field MHD acceleration be accomplished before substantial charge exchange reactions may occur and accordingly the duration of the pulse of current 110 is typically 2 microseconds although other times may be used.

While the orientation of the plates 98 parallel to the radial vapor expansion is provided to prevent the collection of non-ionized vapor particles on the plates, for practical considerations it may be desirable to apply shadow shields 112 to the inner edges of the plates to improve the separation factor by reducing accidental or random collection of non-ionized atoms on the plates 98. As an alternative to drawing the current pulse from the electrode 96, separate electrodes 114, may be provided as shown between each plate 98, at the radially outer end of each chamber 100, for this purpose. In that case electrode 96 serves as a collection plate and may be located farther from chambers 100 to reduce its electric effects.

Having described above the preferred embodiment of the present invention, it will occur to those skilled in the art that various modifications and alterations can be made to the disclosed system without departing from the spirit of the invention. Accordingly, it is intended to limit the scope of the invention only as indicated in the following claims.

I claim:

1. In a system for separating one isotope from an environment containing plural isotopes which are in a vapor state and wherein there is a generally radial vapor flow to the vapor with substantial local flow uniformity, apparatus comprising:
    a plurality of adjacent chambers for collecting vapor components and defined by a plurality of plates between chambers, the plates being positioned parallel to the vapor flow generally to permit passage of said radial vapor flow through said chambers; and
    means for producing a trajectory within said chambers for said one isotope in said radial vapor flow different from the uniform local flow and toward one of said plurality of plates.

2. The apparatus of claim 1 further including:
    means for separately collecting the constituents of said vapor flow not on said trajectory.

3. The apparatus of claim 1 wherein said trajectory producing means including means for selectively ionizing said one isotope in said vapor flow by application of radiant energy to said environment.

4. The apparatus of claim 3 further including means for distributing the applied radiant energy throughout the portion of said environment defined by said plurality of chamber.

5. The apparatus of claim 3 wherein said trajectory producing means includes means for accelerating the ionized isotope toward said trajectory.

6. The apparatus of claim 3 wherein said trajectory producing means includes:

means for applying a magnetic field to said environment in a direction generally othogonal to said vapor flow; and means for producing an electric current in said environment generally othogonal to said magnetic field to accelerate the ions of said one isotope in said field toward said collecting means.

7. The apparatus of claim 1 wherein said trajectory producing means includes:
a plurality of first electrodes, one associated with each chamber;
a second electrode; and
means for applying a signal to said first and second electrodes;
said first and second electrodes being positioned to provide an electrical current therebetween through said plurality of chambers in response to the signal applied to said first and second electrodes.

8. The apparatus of claim 1 wherein said trajectory producing means further includes means for producing a magnetic field in the region of said plates generally perpendicular to said radial vapor flow.

9. In a system for enriching one isotope in a material containing plural isotope wherein a wide angle, radially expanding flow of vapor of said material is generated, a process for separating said one isotope including:
directing the vapor flow into a plurality of adjacent chambers for collecting vapor components, the chamber being defined by plural plates partitioning said chambers;
the vapor flow being directed in flow direction generally parallel to the surfaces of said plates bordering each chamber;
changing the trajectory of said one isotope within each of said plurality of chambers in a direction distinct from the local direction of the remaining constituents of said vapor flow in each chamber; and
collecting said one isotope in each chamber on said trajectory apart from the remaining constituents of said vapor flow.

10. The process of claim 9 wherein the trajectory changing step includes selectively ionizing said one isotope and accelerating the selectively ionized isotope toward one of said plate surfaces.

11. The process of claim 10 wherein said accelerating step includes applying a crossed-field acceleration to said selectively ionized isotope.

12. In a system for the enrichment of one isotope in an environment containing plural isotopes of a material, apparatus comprising:
means for providing a generally radially expanding vapor flow of said plural isotopes over a substantial angle;
a plurality of adjacent chambers defined by plural radial disposed partitions which separate each chamber and have surfaces bounding each chamber which extend generally parallel to the expanding vapor flow;
means for selectively ionizing particles of said one isotope within each of said plurality of chambers over the substantial angle of said radially expanding vapor flow; and
means for accelerating the selectively ionized particles within each of said plurality of chambers in a direction distinct from said vapor flow over the substantial angle thereof.

13. The apparatus of claim 12 wherein said partitions intercept the motion of the accelerated particles to provide collection thereof without corresponding collection of the other constituents of said vapor flow.

14. The apparatus of claim 12 wherein said means for providing a generally radially expanding vapor flow includes means for generating local heating on a surface of said material sufficient to cause vaporization thereof.

15. The apparatus of claim 14 wherein said means for generating local heating includes:
means for producing energy in a propagating beam; and
means for directing said beam to said surface of said material to produce the local heating thereof.

16. The apparatus of claim 15 wherein said beam producing means includes means for producing a beam of electrons.

17. The apparatus of claim 14 wherein said means for generating local heating includes:
means for producing sufficient heat to liquefy a substantial portion of said material; and
means for providing cooled containment for the liquefied material.

18. The apparatus of claim 12 wherein said accelerating means includes a crossed-field MHD accelerator.

19. The apparatus of claim 12 wherein said accelerating means includes means for imparting motion generally perpendicular to said vapor flow.

20. The apparatus of claim 12 further including:
means for applying a magnetic field in the region of said vapor flow within said chambers and generally parallel to the surfaces of said partitions;
means for controlling the application of said magnetic field and electric current to be coexistent within each of said plurality of chambers for a predetermined period subsequent to the selective ionization of said one isotope to accelerate the ions of said one isotope toward said partitions.

21. The apparatus of claim 20 wherein said partitions include shields at the ends thereof facing said vapor flow which inhibit the collection of constituents in said vapor flow on said partitions apart from the accelerated isotope.

22. The apparatus of claim 20 further including means for providing repeated operation of said selective ionizing means.

23. The apparatus of claim 20 wherein said predetermined period is generally less than the time for a charge exchange reaction between selectively ionized particles and said vapor flow.

24. In a system for separating one isotope from an environment containing plural isotopes which are in a vapor state and wherein there is a generally radial vapor to the vapor with substantial local flow uniformity, apparatus comprising:
two or more plates circumferentially positioned with respect to said radial vapor flow and aligned generally parallel thereto to define a plurality of chambers separated by said plates permitting the passage of said radial vapor flow therethrough; and
means for producing a trajectory for said one isotope in said radial vapor flow different from the uniform local flow and toward one of said plates;
a plurality of shadow shields each associated with one of said plates to shield said plates from collection of components of said radial vapor flow other than those on said trajectory toward said plates.

25. The apparatus of claim 24 wherein said trajectory producing means includes:
a first electrode generally circumferential with respect to said radial vapor flow and on the radially outer side of said plates;
a second electrode positioned on the radially inner side of said collection plates; and
means for applying an electric signal to said electrodes to provide an electric current in the region between said plates.

26. In a system for the enrichment of one isotope in an environment containing plural isotopes of a material, apparatus comprising:
means for generating local heating on the surface of said material sufficient to cause vaporization thereof in a generally radially expanding vapor flow of said plural isotopes over a substantial angle;
means for selectively ionizing particles of said one isotope over the substantial angle of said radially expanding vapor flow;
the region above the surface of said material and between said material and the region of selective ionization being generally free of obstructions to said vapor flow; and
means for accelerating the selectively ionized particles in a direction distinct from said vapor flow over the substantial angle thereof.

27. The apparatus of claim 26 wherein said means for generating local heating includes means for producing said local heating in a thin elongated pattern on said surface of said material.

28. A method for separating one isotope from plural isotopes comprising the steps of:
generating an electron beam;
directing said electron beam onto a surface of a material of said plural isotopes and said one isotope desired to be separated to provide a radial expansion of the vapor of said material over a wide angle from the local heating thereof;
permitting the vapor expansion to occupy a substantial angle;
applying radiant energy to the vapor expansion within said substantial angle to produce selective ionization of said one isotope in said vapor expansion; and
collecting the ions resulting from the ionization of said vapor expansion separately from the remainder of the constitutents of said vapor expansion.

29. In a system for enriching one isotope of a material containing plural isotopes, apparatus comprising:
an elongated container of said material open to expose a surface of said material over a wide angle;
a source of electrons;
means for directing said electrons generally onto a line of the surface of said material to produce local heating and vaporization of said material whereby a radially expanding vapor flow is created away from said line;
a plurality of collection plates generally aligned parallel to said line and the flow direction of said radially expanding vapor flow;
means for periodically illuminating the region between said plates with laser energy to selectively ionize said one isotope in said vapor flow;
means for applying a magnetic field to said region between said plates in a direction generally parallel to said line;
means for applying periodic electrical current pulses to said region in a direction orthogonal to said magnetic field in the interval between the periodic illumination in order to accelerate the ions of said one isotope toward said plates in a direction distinct from the direction of the local vapor flow; and
means for collecting the constituents of said vapor flow not accelerated toward said plates.

30. A method for separating one isotope from plural isotopes comprising the steps of:
generating localized heating on a surface of a material of said plural isotopes and said one isotope desired to be separated to provide a radial expansion of a vapor of said material over a wide angle from the local heating thereof;
permitting this vapor expansion to occupy a substantial angle;
directing the vapor flow into a plurality of adjacent chambers for collecting vapor components, the chambers being defined by plural partitions radially disposed about the locally heated material;
the vapor flow being directed generally parallel to the surfaces of said partitions bordering said chambers;
applying radiant energy to the vapor expansion within said substantial angle to produce selective ionization of said one isotope in said vapor expansion;
collecting the ions resulting from the ionization of said vapor expansion separately from the remainder of the constituents of said vapor expansion.

31. The method of claim 30 further including in said collecting step the steps of:
applying a crossed-field to said vapor expansion;
intercepting the flow imparted to the selectively ionized constituents of said vapor by the crossed-field.

* * * * *